(12) United States Patent
Tsukuma et al.

(10) Patent No.: US 11,777,494 B2
(45) Date of Patent: Oct. 3, 2023

(54) LEVEL SHIFT CIRCUIT

(71) Applicant: Mitsubishi Electric Corporation, Tokyo (JP)

(72) Inventors: Yuta Tsukuma, Fukuoka (JP); Hiroshi Yoshida, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 46 days.

(21) Appl. No.: 17/743,302

(22) Filed: May 12, 2022

(65) Prior Publication Data

US 2023/0042745 A1    Feb. 9, 2023

(30) Foreign Application Priority Data

Aug. 3, 2021   (JP) .................................. 2021-127450

(51) Int. Cl.
*H03K 17/687*   (2006.01)
*H03K 3/037*    (2006.01)

(52) U.S. Cl.
CPC ........... *H03K 17/6871* (2013.01); *H03K 3/037* (2013.01); *H03K 2217/0063* (2013.01); *H03K 2217/0072* (2013.01)

(58) Field of Classification Search
CPC ................ H03K 17/6871; H03K 3/037; H03K 2217/0063; H03K 2217/0072
See application file for complete search history.

(56) References Cited

U.S. PATENT DOCUMENTS 7,064,603 B2 *   6/2006   Sakata ................ H03K 17/063
                                                                330/10
2018/0337666 A1   11/2018   Sakai et al.

FOREIGN PATENT DOCUMENTS

JP        2018-196276 A     12/2018

* cited by examiner

*Primary Examiner* — Metasebia T Retebo
(74) *Attorney, Agent, or Firm* — Studebaker & Brackett PC

(57) ABSTRACT

A level shift transistor of a first conductivity type configured to level shift a signal from a primary side circuit to a secondary side circuit between the primary side circuit having a primary side reference potential as reference and the secondary side circuit having a secondary side reference potential independent from the primary side reference potential as reference, a diode connected in a forward direction between a first main electrode of the level shift transistor and the secondary side circuit, a capacitor connected in parallel to the diode, and an inverter configured to invert the signal are provided. A control electrode of the level shift transistor is connected to a primary side power supply of the primary side circuit, and a second main electrode thereof is connected to an output of the inverter. The inverter operates between the primary side reference potential and the primary side power supply.

4 Claims, 7 Drawing Sheets

LEVEL SHIFT CIRCUIT

BACKGROUND OF THE INVENTION

Field of the Invention

The present disclosure relates to a level shift circuit that transmits a signal on the low-voltage side to a high-voltage side having a different reference potential.

Description of the Background Art

A power device control IC such as a High Voltage MOS Gate Driver IC (HVIC) is a high breakdown voltage IC that drives the gate of a switching device using an input signal from a microcomputer and the like. The HVIC includes, for example, as illustrated in FIG. 1 of Japanese Patent Application Laid-Open No. 2018-196276, a high-side gate drive circuit for driving a high-voltage side (high side) switching device and low-side gate drive circuit for driving a low-voltage side (low side) switching device.

The high-side gate drive circuit has a high-voltage level shift circuit that transmits a signal on the low-voltage side to a high-voltage side having a different reference potential. The high-voltage level shift circuit converts a voltage signal of the primary side circuit having the ground potential (GND) as reference into a current signal with a high breakdown voltage a Metal Oxide Semiconductor Field Effect Transistor (MOSFET), and transmits the voltage signal to the secondary side circuit having the floating potential as reference. The transmitted current signal is restored to a voltage signal in the secondary circuit.

More specifically, in the high-side gate drive circuit, when an on pulse synchronized with the rise of the high-side input signal is input, the gate potential of the high breakdown voltage MOSFET of the high-voltage level shift circuit changes from the GND to the power supply potential of the primary side circuit, opening between a gate and a source to turn the high-side gate drive circuit ON. While being ON, a current flows from the power supply of the secondary circuit to the GND of the primary circuit via the high breakdown voltage MOSFET. The current signal of the current is converted into a voltage signal by a resistance element provided in the secondary circuit, so that the current signal is transmitted to the secondary circuit. When an off pulse synchronized with the fall of the high-side input signal is input, the gate potential of the high breakdown voltage MOSFET of the high-voltage level shift circuit changes from the power supply potential of the primary side circuit to the GND, closing between the gate and the source portion to turn the high-side gate drive circuit OFF.

In the case of the conventional high-voltage level shift circuit described above, the transmission signal source, that is, the current flowing from the secondary side circuit to the primary side circuit is attenuated, when the power supply of the secondary side circuit becomes the GND or less, potentially occurring a phenomenon of signal transmission malfunction.

SUMMARY

An object of the present disclosure is to provide a level shift circuit capable of transmitting a signal even when the power supply of a secondary circuit becomes equal to or lower the GND.

According to the present disclosure, a level shift circuit includes a level shift transistor of a first conductivity type configured to level shift a signal from a primary side circuit to a secondary side circuit between the primary side circuit having a primary side reference potential as reference and the secondary side circuit having a secondary side reference potential independent from the primary side reference potential as reference, a diode connected in a forward direction between a first main electrode of the level shift transistor and the secondary side circuit, a capacitor connected in parallel to the diode, and an inverter configured to invert the signal are provided. A control electrode of the level shift transistor is connected to a primary side power supply of the primary side circuit, and a second main electrode thereof is connected to an output of the inverter. The inverter operates between the primary side reference potential and the primary side power supply. The diode is connected to a secondary power supply of the secondary side circuit via a resistance element.

According to the level shift circuit of the present disclosure, when the level shift transistor is turned on when the secondary side power supply is equal to or lower than the primary side reference potential, the potential of the electrode on the primary side circuit side of the capacitor drops to the primary side reference potential. At the moment of the drop, the potentials of the two electrodes of the capacitor act to maintain the retained state, so the potential of the electrode on the secondary circuit side of the capacitor drop accordingly. The dropped voltage is applied to the resistance element; therefore, the signal is transmitted to the secondary side circuit.

These and other objects, features, aspects and advantages of the present disclosure will become more apparent from the following detailed description of the present disclosure when taken in conjunction with the accompanying drawings.

DESCRIPTION OF THE PREFERRED EMBODIMENTS

Configuration of HVIC

Figure 1:
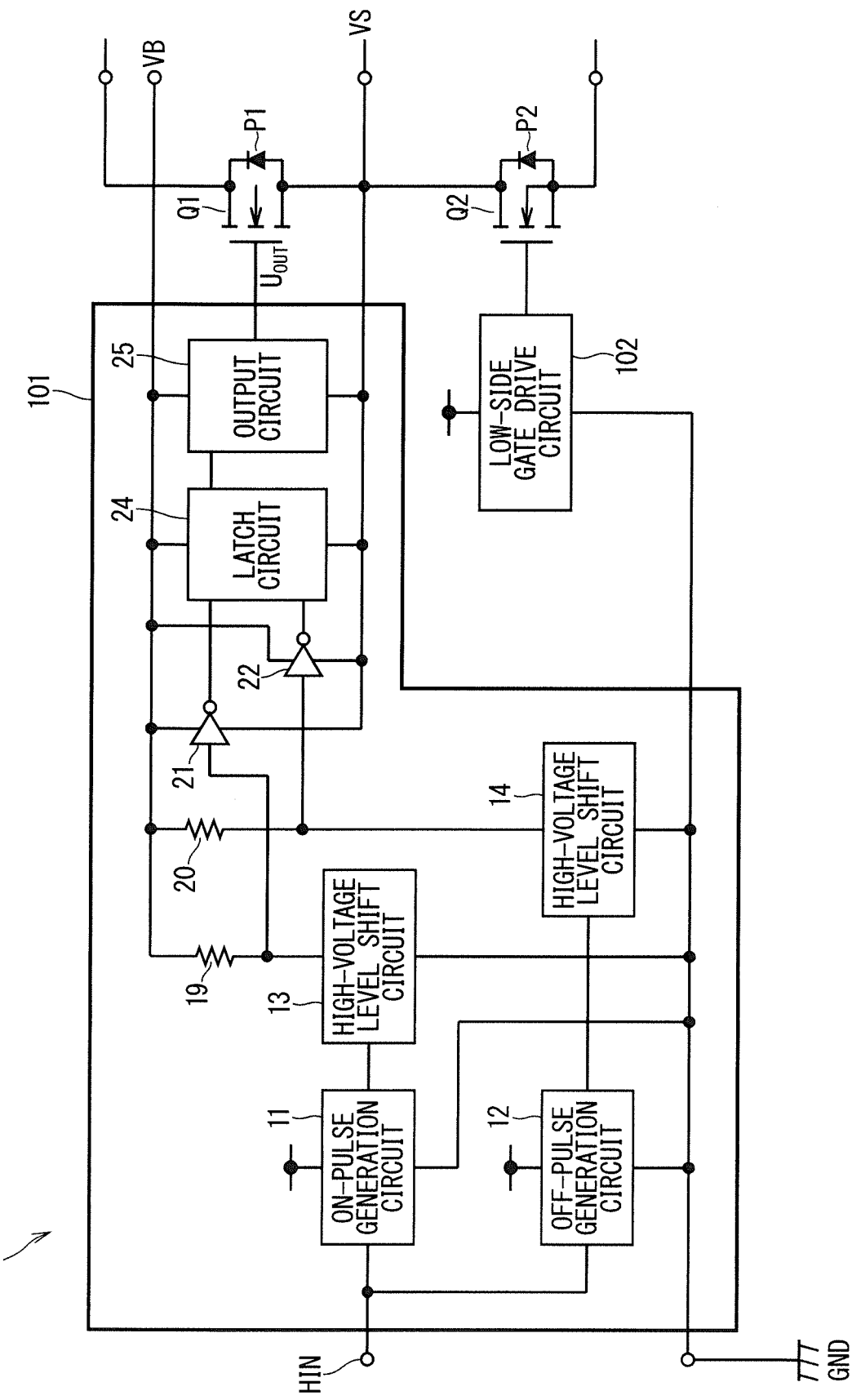
FIG. 1 is a diagram illustrating a configuration of an HVIC incorporating a high-voltage level shift circuit according to the present disclosure.

FIG. 1 is a diagram illustrating a configuration of an HVIC 100 incorporating a high-voltage level shift circuit according to the present disclosure. The HVIC 100 includes a high-side gate drive circuit 101 that drives a high-side switching device Q1 and a low-side gate drive circuit 102 that drives a low-side switching device Q2. The high-side switching device Q1 and the low-side switching device Q2 are both N-channel MOSFETs, and the freewheeling diodes P1 and P2 are connected in antiparallel, respectively. Although in FIG. 1, the high-side switching device Q1 and the low-side switching device Q2 are MOSFETs, Insulated Gate Bipolar Transistors (IGBTs) may also be adoptable.

Hereinafter, the configuration of the high-side gate drive circuit 101 will be described. The high-side gate drive circuit 101 includes an on-pulse generation circuit 11, an off-pulse generation circuit 12, a high-voltage level shift circuit 13, a high-voltage level shift circuit 14, a resistance element 19, a resistance element 20, a NOT gate 21, a NOT gate 22, a latch circuit 24. and an output circuit 25.

A high-side input signal HIN input to the high-side gate drive circuit 101 is input to the on-pulse generation circuit 11 and the off-pulse generation circuit 12. The on-pulse generation circuit 11 generates an on pulse synchronized with the rising timing of the high-side input signal HIN. The off-pulse generation circuit 12 generates an off pulse synchronized with the falling timing of the high-side input signal HIN.

The output of the on-pulse generation circuit 11 is connected to the gate of the high breakdown voltage MOSFET for level shift in the high-voltage level shift circuit 13. The drain of the high breakdown voltage MOSFET is fixed to a high-side power supply voltage VB which is the power supply of the secondary side circuit (referred to as "secondary side power supply") via the resistance element 19 and is connected to the input terminal of the latch circuit 24 via the NOT gate 21. The source of the high breakdown voltage MOSFET is connected to the ground potential GND, which is the reference potential of the primary side circuit (referred to as "primary side reference potential"). The high-side power supply voltage VB may be referred to as a high-side power supply VB, and the ground potential GND may be simply referred to as GND.

The output of the off-pulse generation circuit 12 is connected to the gate of the high breakdown voltage MOSFET for level shift in the high-voltage level shift circuit 14. The drain of the high breakdown voltage MOSFET is fixed to the high-side power supply voltage VB via the resistance element 20 and connected to the input terminal of the latch circuit 24 via the NOT gate 22. The source of the high breakdown voltage MOSFET is connected to the ground potential GND. The specific configurations of the high-voltage level shift circuits 13 and 14 will be described later.

The latch circuit 24 is composed of an RS flip-flop circuit or the like, and latches the outputs from the NOT gates 21 and 22 and outputs them to the output circuit 25.

The output circuit 25 switches the output voltage to the output terminal $U_{OUT}$ between the high-side power supply voltage VB, which is the reference potential of the secondary side circuit (referred to as "secondary side reference potential") and a high-side floating potential VS, according to the output of the latch circuit 24.

First Embodiment

Device Configuration

Figure 2:
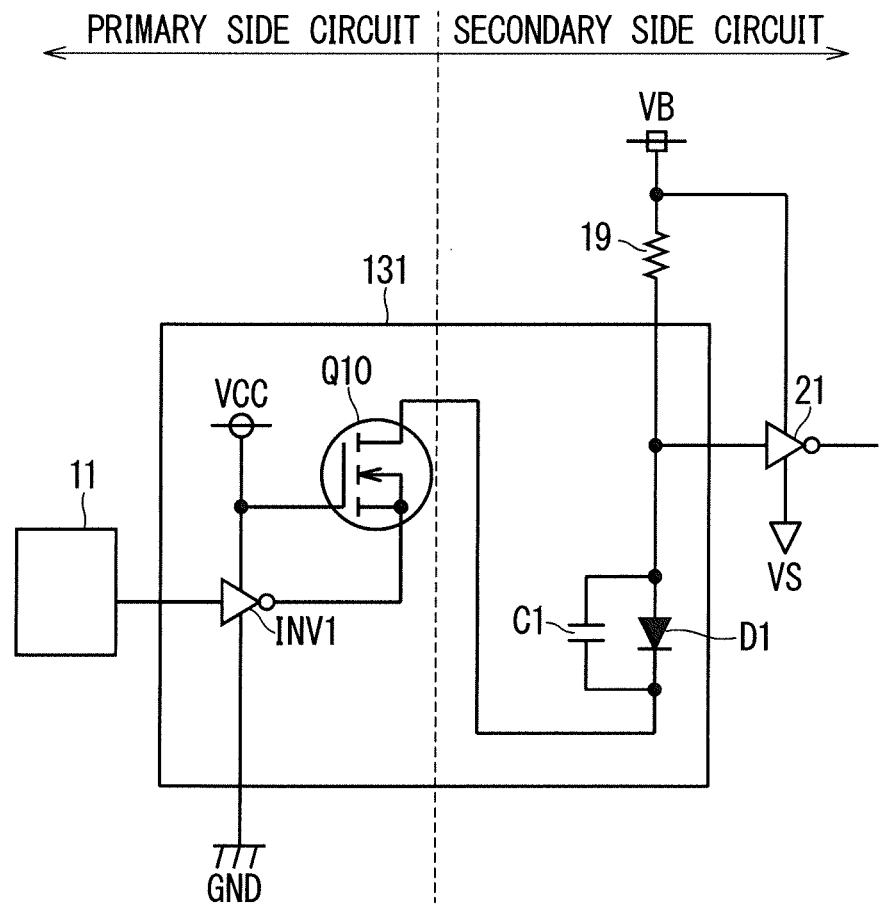
FIG. 2 is a circuit diagram illustrating a configuration of a high-voltage level shift circuit of the first embodiment according to the present disclosure.

FIG. 2 is a circuit diagram illustrating a configuration of a high-voltage level shift circuit 131 of the first embodiment according to the present disclosure. In the following, with a high breakdown voltage MOSFET Q10, which is the level shift transistor as a boundary, the on-pulse generation circuit 11 side is referred to as a primary side circuit and the NOT gate 21 side is referred to as a secondary side circuit. The high-voltage level shift circuit 131 is a circuit corresponding to the high-voltage level shift circuit 13 illustrated in FIG. 1.

As illustrated in FIG. 2, it is configured that the gate of the high breakdown voltage MOSFET Q10 of the high-voltage level shift circuit 131 is connected to a low-side power supply VCC, which is the power supply of the primary side circuit (referred to as "primary side power supply") and the on pulse output from the on-pulse generation circuit 11 is supplied to the source of the MOSFET Q10 via an inverter INV1. The voltage supplied from the low-side power supply VCC may be referred to as a low-side power supply voltage VCC.

The inverter INV1 operates between the low-side power supply voltage VCC supplied from the low-side power supply VCC and GND.

The drain of the high breakdown voltage MOSFET Q10 is connected to a cathode of a forward diode D1. A capacitor C1 is connected in parallel to the forward diode D1.

An anode of the forward diode D1 is connected to the high-side power supply VB via the resistance element 19. The anode of the forward diode D1 is also connected to the input of the NOT gate 21. The NOT gate 21 operates between the high-side power supply voltage VB and the high-side floating potential VS.

Figure 3:
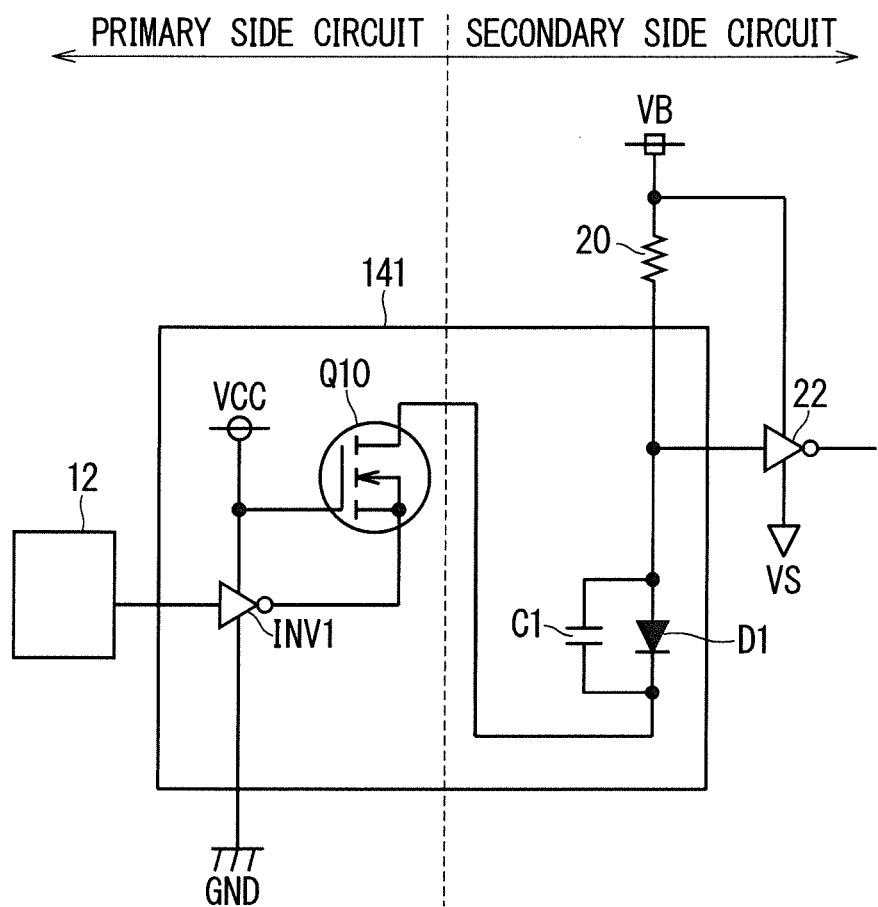
FIG. 3 is a circuit diagram illustrating a configuration of a high-voltage level shift circuit of the first embodiment according to the present disclosure.

FIG. 3 is a circuit diagram illustrating a configuration of a high-voltage level shift circuit 141 of the first embodiment. The high-voltage level shift circuit 141 is a circuit corresponding to the high-voltage level shift circuit 14 illustrated in FIG. 1.

The configuration of the high-voltage level shift circuit 141 is the same as that of the high-voltage level shift circuit 131 illustrated in FIG. 2, except for the connection relationship with the primary side circuit and the secondary side circuit. That is, it is configured that the off pulse output from the off-pulse generation circuit 12 is supplied to the source of the high breakdown voltage MOSFET Q10 of the high-voltage level shift circuit 141 via the inverter INV1 and the high-side power supply voltage VB is applied to the anode of the forward diode D1 via the resistance element 20. The anode of the forward diode D1 is also connected to the input of the NOT gate 22. The NOT gate 22 operates between the high-side power supply voltage VB and the high-side floating potential VS.

Operation

Hereinafter, the operation of the high-voltage level shift circuit 131 will be described, and the operation description of the high-voltage level shift circuit 141 will be omitted because of the same operation.

It is assumed that a state where a low level signal, that is, a voltage equal to or lower than the threshold voltage of the inverter INV1 is applied to the input of the inverter INV1 is an initial state. Here, the voltage equal to or lower than the threshold voltage of the inverter INV1 is a voltage equal to or lower the threshold voltage of the N-channel MOSFET and higher than the threshold voltage of the P-channel MOSFET in the series connection between the P-channel MOSFET and the N-channel MOSFET constituting the inverter INV1. In the state, the P-channel MOSFET is turned on and the low-side power supply voltage VCC and the source of the high breakdown voltage MOSFET Q10 are connected, the gate potential and source potential of the high breakdown voltage MOSFET Q10 are equal to the low-side power supply voltage VCC, and the high breakdown voltage MOSFET Q10 is in the off state.

Next, when the high level signal is input to the input of the inverter INV1, the P-channel MOSFET constituting the inverter INV1 turns off, the N-channel MOSFET turns on, the source potential of the high breakdown voltage MOSFET Q10 drops to the GND, and the high breakdown voltage MOSFET Q10 is turned on. At this point, when the high-side power supply voltage VB is higher than the GND, a current flows from the high-side power supply VB toward the high breakdown voltage MOSFET Q10, a voltage signal $\Delta V$ is generated in the resistance element 19, and the signal is transmitted to the secondary side circuit.

On the other hand, when the high breakdown voltage MOSFET Q10 is turned on when the high-side power supply voltage VB is equal to or lower than the GND, the potential of the electrode on the primary circuit side of the capacitor C1 drops to the GND. At the moment of the drop, the potentials of the two electrodes of the capacitor C1 act to maintain the retained state, so the potential of the electrode on the secondary circuit side of the capacitor C1 drop accordingly. Assuming that the dropped voltage is $\Delta V$, the voltage $\Delta V$ is applied to the resistance element 19, so that the signal is transmitted to the secondary side circuit. After that, the voltage $\Delta V$ gradually lowers according to the time constant of the RC circuit of the capacitor C1 and the resistance element 19, and the electrode on the secondary side circuit of the capacitor C1 rises to the high-side power supply voltage VB. At this point, the drain current flows transiently.

Further, when the high-side power supply voltage VB becomes equal to or lower than the GND, a current may flow from the drain side of the high breakdown voltage MOSFET Q10 to a back gate (GND), however, the current is blocked by the diode D1.

As described above, the high-voltage level shift circuit 131 of the first embodiment can transmit a signal to the secondary side circuit even when the high-side power supply voltage VB of the secondary side circuit drops equal to or lower than the GND.

Second Embodiment

Device Configuration

Figure 4:
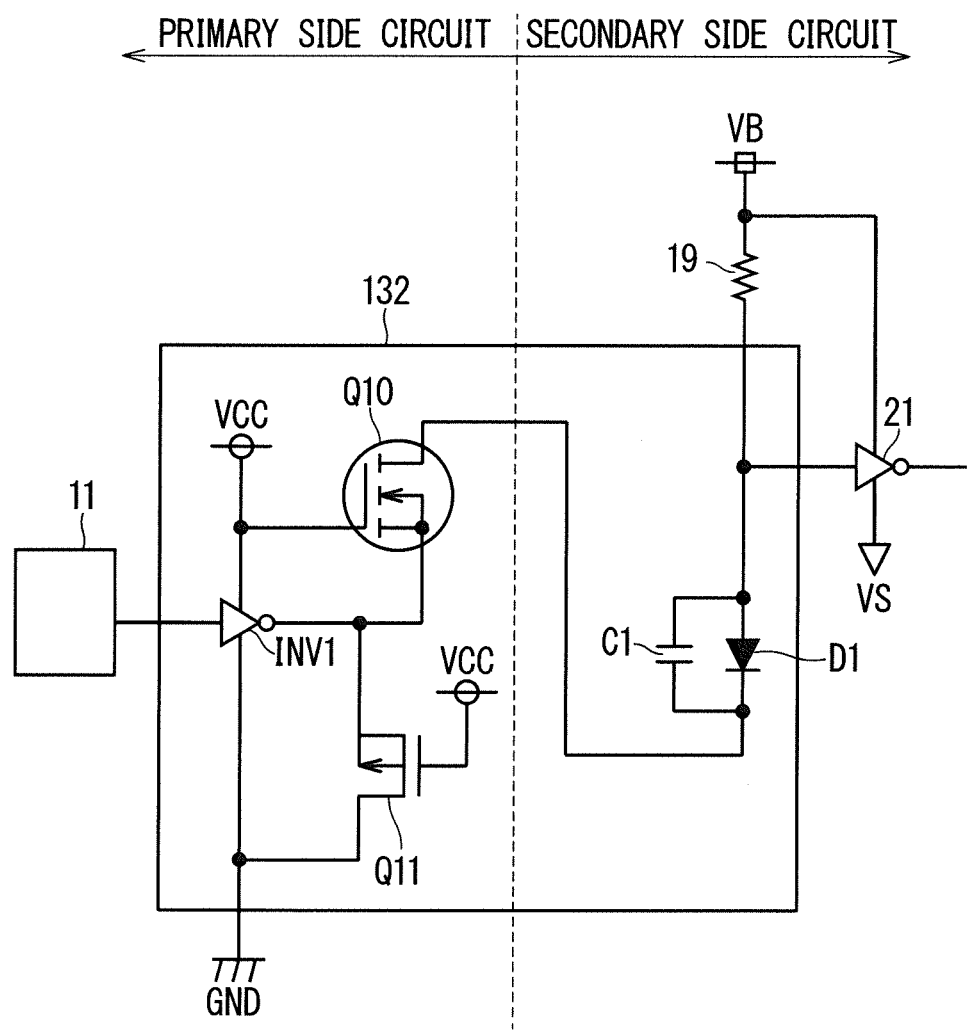
FIG. 4 is a circuit diagram illustrating a configuration of a high-voltage level shift circuit of the second embodiment according to the present disclosure.

FIG. 4 is a circuit diagram illustrating a configuration of a high-voltage level shift circuit 132 of the second embodiment according to the present disclosure. It should be noted that, in FIG. 4, the same components as those of the high-voltage level shift circuit 131 described with reference to FIG. 2 are designated by the same reference numerals, and duplicate description will be omitted. The high-voltage level shift circuit 132 is a circuit corresponding to the high-voltage level shift circuit 13 illustrated in FIG. 1.

As illustrated in FIG. 4, in the high-voltage level shift circuit 132, a P-channel type MOSFET Q11 connected between the source of the high breakdown voltage MOSFET Q10 and the GND is provided, and to the gate of the MOSFET Q11, the low-side power supply voltage VCC is applied.

Figure 5:
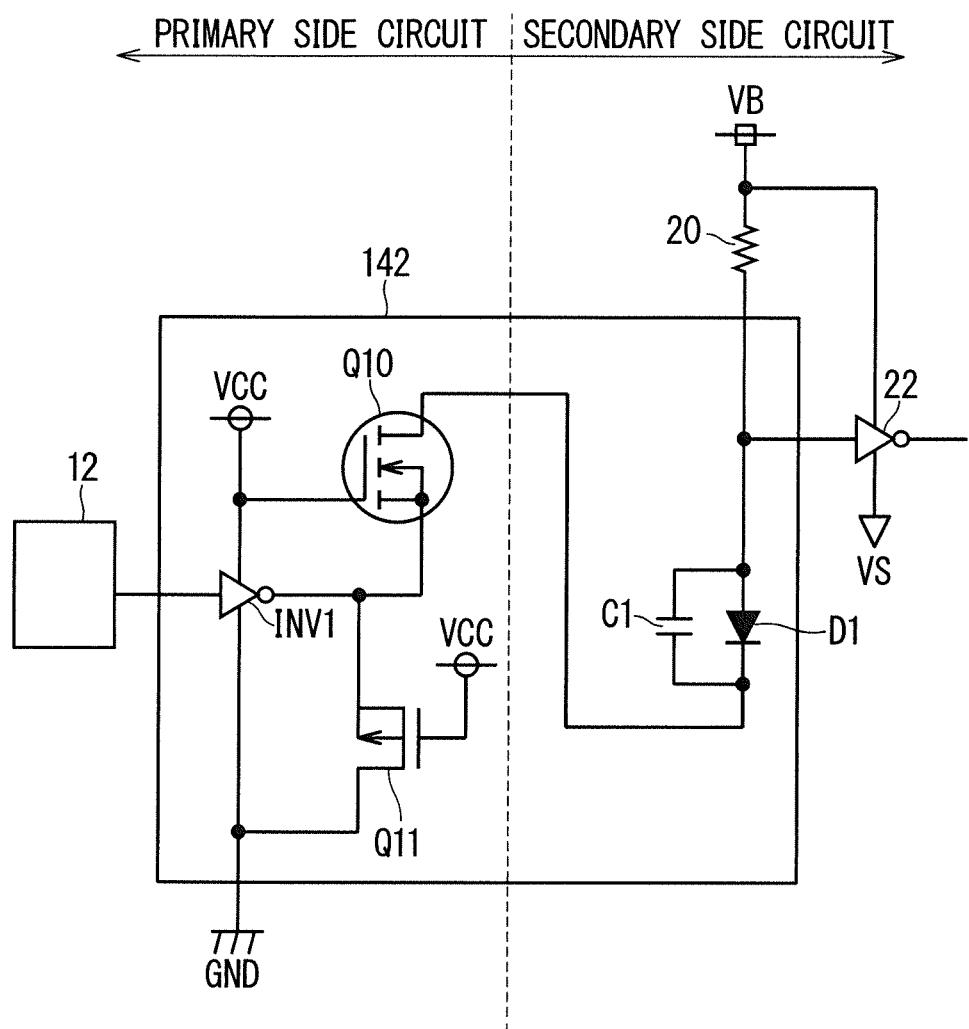
FIG. 5 is a circuit diagram illustrating a configuration of a high-voltage level shift circuit of the second embodiment according to the present disclosure.

FIG. 5 is a circuit diagram illustrating a configuration of a high-voltage level shift circuit 142 of the second embodiment. The configuration of the high-voltage level shift circuit 142 is the same as that of the high-voltage level shift circuit 132 illustrated in FIG. 4, and the connection relationship between the primary side circuit and the secondary side circuit is the same as that of the high-voltage level shift circuit 131 illustrated in FIG. 3.

Operation

Hereinafter, the operation of the high-voltage level shift circuit 132 will be described, and the operation of the high-voltage level shift circuit 142 is also the same; therefore, the operation description of the high-voltage level shift circuit 142 will be omitted.

First, consider a case where when the high-side floating potential VS rises sharply using the high-voltage level shift circuit 131, that is, the potential between the high-side floating potential VS and the GND rises sharply, and a positive voltage change (+dv/dt) occurs.

At this point, a displacement current flows from the secondary side circuit to the primary side circuit. The displacement current behaves as follows depending on the state of input thereof to the high-voltage level shift circuit 131.

First, when a high level signal is input to the inverter INV1, the N-channel MOSFET constituting the inverter INV1 is turned on, and the displacement current flows to the GND via the N-channel MOSFET.

Next, when a low level signal is input to the inverter INV1, the N-channel MOSFET constituting the inverter INV1 is turned off, the impedance becomes high between the inverter INV and the GND, causing a state where the current flows toward the GND less smoothly. Therefore, the displacement current may flow from the drain side of the P-channel MOSFET toward the back gate (GND) via the diode parasitic on the body of the P-channel MOSFET constituting the inverter INV1.

On the other hand, in the high-voltage level shift circuit 132, as illustrated in FIG. 4, the P-channel MOSFET Q11 is provided between the source of the high breakdown voltage MOSFET Q10 and the GND, and the MOSFET Q11 is in the off state under the situation of a low level signal being input to the inverter INV1.

On the other hand, the impedance between the inverter INV1 and the GND becomes high, causing the state where the current flows toward the GND less smoothly, and if +dv/dt occurs at this point and the displacement current flows from the secondary side circuit to the primary side circuit, the potential on the source side of the MOSFET Q11 rises, the normally-off MOSFET Q11 turns on, allowing the displacement current to flow to the GND via the MOSFET Q11.

As described above, the high-voltage level shift circuit 132 of the second embodiment releases the displacement current generated when the high-side floating potential VS sharply rises to the GND, which is the primary side reference potential, regardless of the input state, suppressing the occurrence of defects caused by the displacement current.

The high-voltage level shift circuit 132 can also transmit a signal to the secondary side circuit even when the high-side power supply voltage VB of the secondary side circuit drops equal to or lower than the GND.

Third Embodiment

Device Configuration

Figure 6:
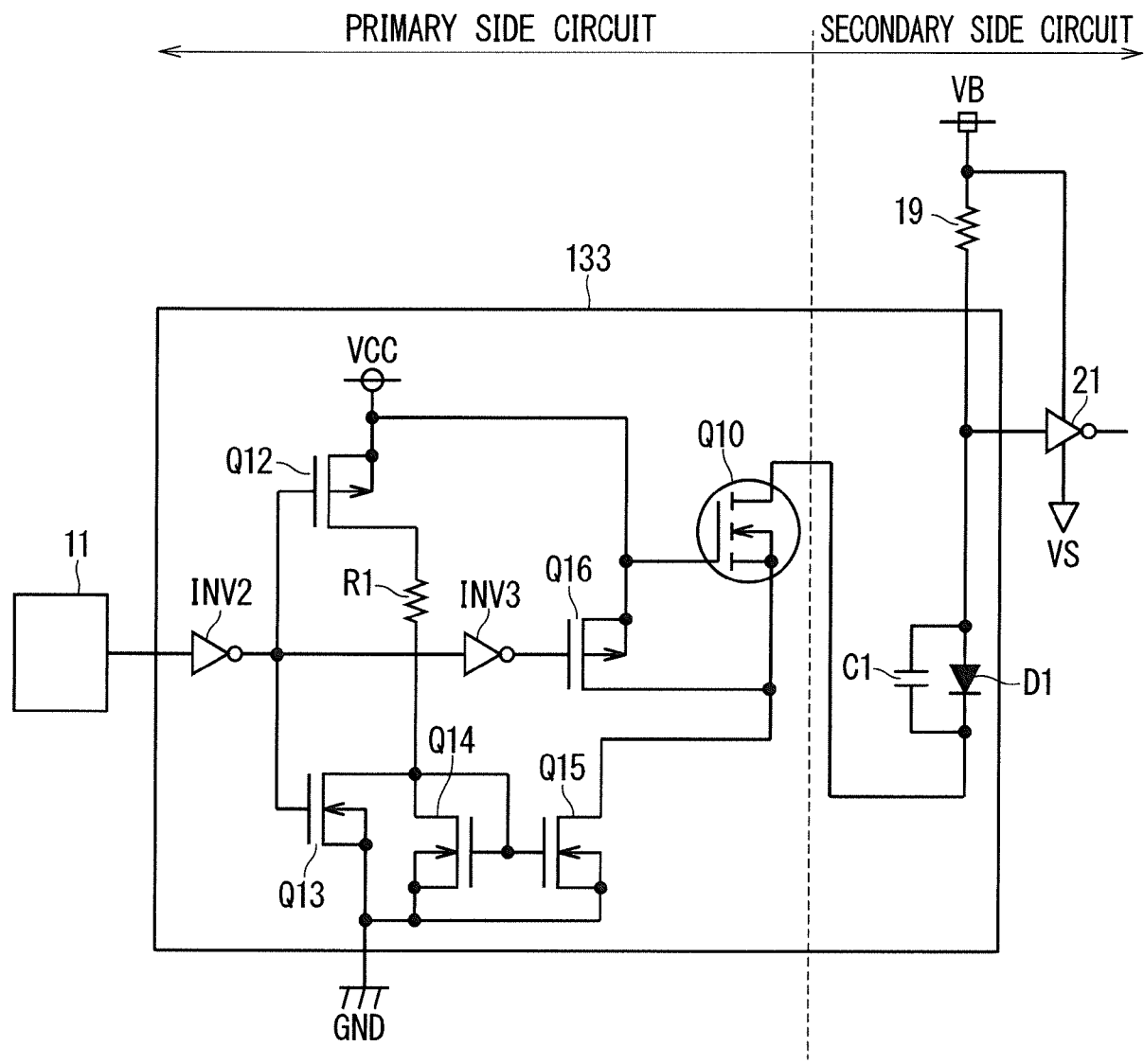
FIG. 6 is a circuit diagram illustrating a configuration of a high-voltage level shift circuit of the third embodiment according to the present disclosure.

FIG. 6 is a circuit diagram illustrating a configuration of a high-voltage level shift circuit 133 of the third embodiment according to the present disclosure. The high-voltage level shift circuit 133 is a circuit corresponding to the high-voltage level shift circuit 13 illustrated in FIG. 1.

As illustrated in FIG. 6, the gate of the high breakdown voltage MOSFET Q10 of the high-voltage level shift circuit 133 is connected to the low-side power supply VCC of the primary side circuit, and the P channel type MOSFET Q16 is connected between the gate and the source of the high breakdown voltage MOSFET Q10. In addition, it is configured that an N-channel MOSFET Q15 is connected between the source of the high breakdown voltage MOSFET Q10 and the GND, and turning off of the P-channel MOSFET Q16 and turning on of the MOSFET Q15 turns on the high breakdown voltage MOSFET Q10.

It is configured that, to the gate of the MOSFET, Q16, an on pulse output from the on-pulse generation circuit 11 is supplied via inverters INV2 and INV3 connected in series. Although not illustrated, the inverters INV2 and INV3 operate between the low-side power supply voltage VCC and the GND.

The drain of the high breakdown voltage MOSFET Q10 is connected to the cathode of the forward diode D1. A capacitor C1 is connected in parallel to the forward diode D1.

An anode of the forward diode D1 is connected to the high-side power supply VB via the resistance element 19. The anode of the forward diode D1 is also connected to the input of the NOT gate 21.

Further, a P-channel type MOSFET Q12, a resistance element R1 and an N-channel type MOSFET Q13 are connected in series between the low-side power supply VCC and the GND, and the output of the inverter INV2 is connected to the gates of the MOSFET Q12 and the MOSFET Q13.

Further, an N-channel type MOSFET Q14 is connected between the connection node between the resistance element R1 and the MOSFET Q13 and the GND. The gate of the MOSFET Q14 is connected to the connection node between the resistance element R1 and the MOSFET Q13 in common with the gate of the MOSFET Q15. The MOSFET Q15 constitutes the primary side of the current mirror circuit, and the resistance element R1 and the MOSFET Q14 constitute the secondary side of the current mirror circuit.

Figure 7:
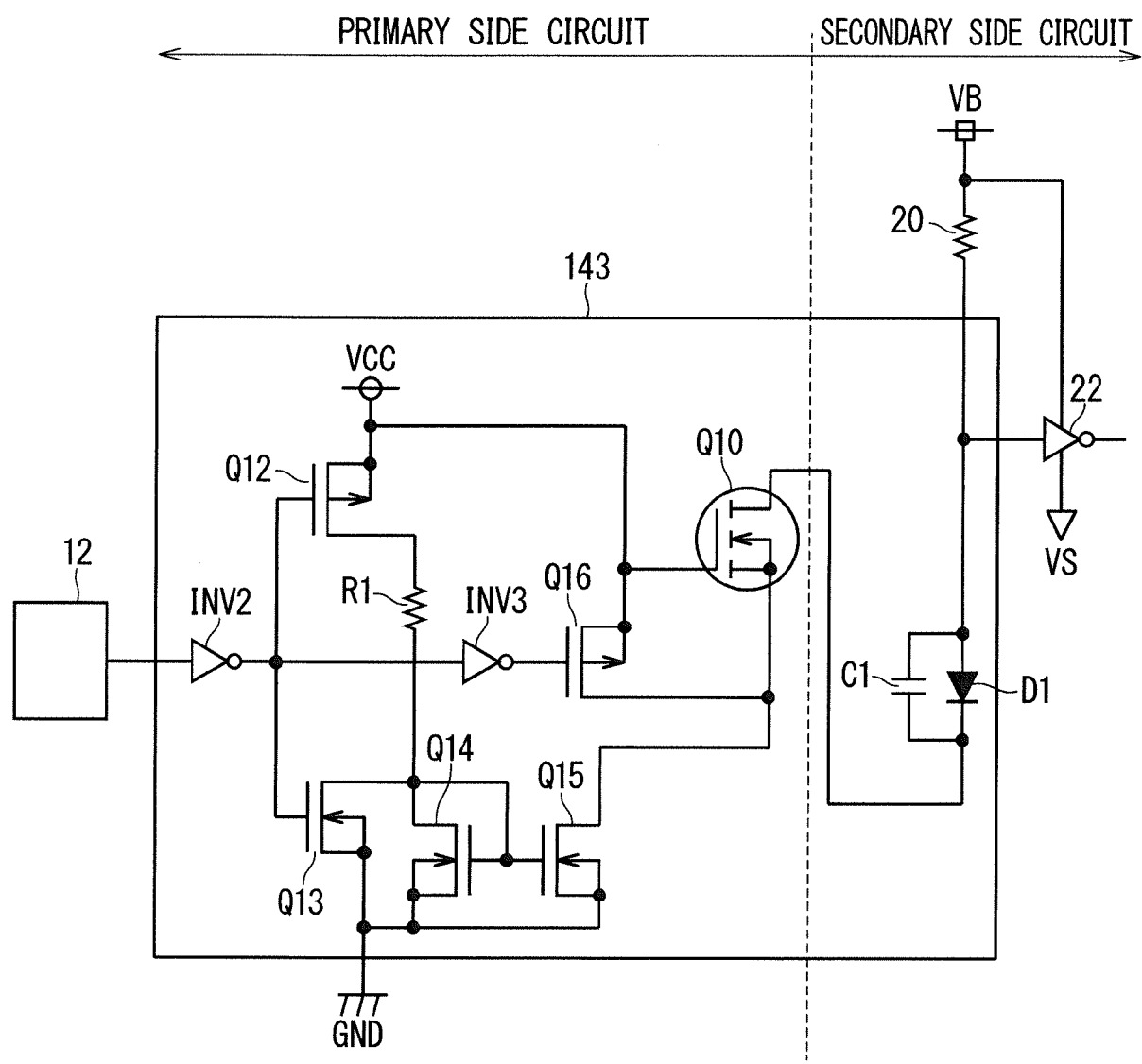
FIG. 7 is a circuit diagram illustrating a configuration of a high-voltage level shift circuit of the third embodiment according to the present disclosure.

FIG. 7 is a circuit diagram illustrating a configuration of a high-voltage level shift circuit 143 of the third embodiment. The high-voltage level shift circuit 143 is a circuit corresponding to the high-voltage level shift circuit 14 illustrated in FIG. 1.

The configuration of the high-voltage level shift circuit 143 is the same as that of the high-voltage level shift circuit 133 illustrated in FIG. 2, except for the connection relationship with the primary side circuit and the secondary side circuit. That is, it is configured that, to the gate of the MOSFET Q16 of the high-voltage level shift circuit 143, an off pulse output from the off-pulse generation circuit 12 via the inverters INV2 and INV3 connected in series is applied, and the anode of the forward diode D1 is connected to the high-side power supply VB via the resistance element 20. The anode of the forward diode D1 is also connected to the input of the NOT gate 22.

Operation

Hereinafter, the operation of the high-voltage level shift circuit 133 will be described, and the operation of the high-voltage level shift circuit 143 is also the same; therefore, the operation description of the high-voltage level shift circuit 143 will be omitted.

It is assumed that a state where a low level signal, that is, a voltage equal to or lower than the threshold voltage of the inverter INV2 is applied to the input of the inverter INV2 is an initial state. Here, the definition of the voltage equal to or lower than the threshold voltage of the inverter INV2 is synonymous with the definition of the voltage equal to or lower than the threshold voltage of the inverter INV1 described in the first embodiment.

When a low level signal is input to the input of the inverter INV2, the inverter INV2 outputs a high level signal. While the MOSFET Q13 is turned on by the high level signal output by the inverter INV2, the MOSFET Q12 is turned off; therefore, the current mirror circuit does not operate. The high level signal output by the inverter INV2 is input to the inverter INV3, the inverter INV3 outputs the low level signal, and the MOSFET Q16 turns on. However, the high breakdown voltage MOSFET Q10 is in the off state because the MOSFET Q15 does not turn on.

Next, when a high level signal is input to the input of the inverter INV2, the inverter INV2 outputs a low level signal. The low level signal output by the inverter INV2 turns on the MOSFET Q12, but turns off the MOSFET Q13. The low level signal output by the inverter INV2 is input to the inverter IV3, the inverter IV3 outputs the high level signal, the MOSFET Q16 turns off, and the low side power supply VCC and the source of the high breakdown voltage MOSFET Q10 are disconnected.

Here, when the MOSFET Q14 and the MOSFET Q15 have the same capability, the drain current of the MOSFET Q14 and the drain current of the MOSFET Q15 become the same. The drain current of the MOSFET Q15 is the drain current of the high breakdown voltage MOSFET Q10; therefore, the drain current of the MOSFET Q15 becomes equivalent to the drain current of the MOSFET Q14, that is, the current flowing through the resistance element R1. That is, the drain current of the high breakdown voltage MOSFET Q10 can be limited when a high level signal is being input to the input of the inverter INV2.

As described above, the high-voltage level shift circuit 133 of the third embodiment is provided with the current mirror circuit, so that the drain current of the high breakdown voltage MOSFET Q10 can be limited, and an overcurrent of the high breakdown voltage MOSFET Q10 can be suppressed from flowing.

The high-voltage level shift circuit 133 can also transmit a signal to the secondary side circuit even when the high-side power supply voltage VB of the secondary side circuit drops equal to or lower than the GND.

In the present disclosure, the embodiments can be combined, appropriately modified or omitted, without departing from the scope of the disclosure.

What is claimed is:
1. A level shift circuit comprising:
a level shift transistor of a first conductivity type configured to level shift a signal from a primary side circuit to a secondary side circuit between the primary side circuit having a primary side reference potential as reference and the secondary side circuit having a secondary side reference potential independent from the primary side reference potential as reference;
a diode connected in a forward direction between a first main electrode of the level shift transistor and the secondary side circuit;
a capacitor connected in parallel to the diode; and
an inverter configured to invert the signal, wherein
a control electrode of the level shift transistor is connected to a primary side power supply of the primary side circuit, and a second main electrode thereof is connected to an output of the inverter,
the inverter operates between the primary side reference potential and the primary side power supply, and the diode is connected to a secondary power supply of the secondary side circuit via a resistance element.

2. The level shift circuit according to claim 1, further comprising
a transistor of a second conductivity type connected between the second main electrode of the level shift transistor and the primary side reference potential, and a control electrode thereof connected to the primary side power supply.

3. A level shift circuit comprising:
a level shift transistor of a first conductivity type configured to level shift a signal from a primary side circuit to a secondary side circuit between the primary side circuit having a primary side reference potential as reference and the secondary side circuit having a secondary side reference potential independent from the primary side reference potential as reference;
a diode connected in a forward direction between a first main electrode of the level shift transistor and the secondary side circuit;
a capacitor connected in parallel to the diode;
a first transistor of a second conductivity type connected between a control electrode of the level shift transistor and a second main electrode;
a current mirror circuit in which a primary side is connected to the second main electrode of the level shift transistor and a secondary side is connected between a primary side power supply of the primary side circuit and the primary side reference potential via a second transistor of the second conductivity type;
a third transistor of the first conductivity type connected between the secondary side of the current mirror and the primary side reference potential;
a first inverter configured to invert the signal; and
a second inverter configured to invert output of the first inverter, wherein
the control electrode of the level shift transistor is connected to the primary side power supply,
a control electrode of the first transistor is connected to an output of the second inverter,
a control electrode of each of the second transistor and the third transistor is connected to an output of the first inverter, and
the diode is connected to a secondary power supply of the secondary side circuit via a resistance element.

4. The level shift circuit according to claim 3, wherein
the primary side of the current mirror circuit includes a fourth transistor of the first conductivity type connected between the second main electrode of the level shift transistor and the primary side reference potential,
the secondary side of the current mirror circuit includes a first resistance element and a fifth transistor of the first conductivity type sequentially provided between the second transistor and the primary side reference potential, and
a control electrode of each of the fourth transistor and the fifth transistor is connected to a connection node between the first resistance element and the third transistor in common.

* * * * *